United States Patent [19]

Boitard et al.

[11] Patent Number: 5,373,099
[45] Date of Patent: Dec. 13, 1994

[54] FIXING DEVICE FOR FIXING ELECTRONIC COMPONENT AGAINST A WALL OF A HEATSINK

[75] Inventors: Pierre-Yves Boitard, Sainte Savine; Bernard Furier, Laubressel, both of France

[73] Assignee: Alcatel Converters, Paris, France

[21] Appl. No.: 8,988

[22] Filed: Jan. 26, 1993

[30] Foreign Application Priority Data

Jan. 28, 1992 [FR] France ............... 92 00871

[51] Int. Cl.$^5$ ............................................ H01L 23/26
[52] U.S. Cl. .................... 174/16.3; 257/718; 267/160; 361/709
[58] Field of Search ............... 174/16.3; 361/704, 707, 361/709, 710, 807, 809; 257/178, 719; 267/158, 160

[56] References Cited

U.S. PATENT DOCUMENTS

| | | | |
|---|---|---|---|
| 4,674,005 | 6/1987 | Lacz | 361/388 |
| 4,872,089 | 10/1989 | Ocken et al. | 174/16.3 |
| 4,899,255 | 2/1990 | Case et al. | 361/386 |
| 4,972,294 | 11/1990 | Moses, Jr. et al. | 361/386 |
| 5,079,567 | 1/1992 | Beaman et al. | 361/386 |
| 5,179,506 | 1/1993 | Corbett et al. | 361/417 |
| 5,225,965 | 7/1993 | Bailey et al. | 361/386 |
| 5,237,485 | 8/1993 | Cognetti de Martiis et al. | 361/712 |
| 5,274,193 | 12/1993 | Bailey et al. | 174/16.3 |
| 5,280,409 | 1/1994 | Selna et al. | 361/720 |

FOREIGN PATENT DOCUMENTS 2604593 4/1988 France .
8423052 11/1985 Germany .

OTHER PUBLICATIONS

Technical Notes, A Publication of RCA, No. 1262, Oct. 7, 1980, Princeton, N.J., USA, p. 2239; W. F. Speer: "electrical assembly retainer".

*Primary Examiner*—Leo P. Picard
*Assistant Examiner*—Christopher Horgan
*Attorney, Agent, or Firm*—Sughrue, Mion, Zinn, Macpeak & Seas

[57] ABSTRACT

A fixing device for fixing an electronic component (10) against a first wall (11) of a heatsink (12) includes at least one end branch engaged in a recess (81) provided in a second wall (82) of the heatsink (12) at right angles to the first wall (11). An abutment segment or support section opposite to the end branch is designed to bear against the front face of the component (10) and is connected to the end branch by a resilient segment so that a spring biased pressure is exerted on the front face of the component (10). The end branch is substantially freely engaged in the recess (81), which recess is in a direction perpendicular to the second wall (82). The end branch is held inside the recess (81) by being braced therein when the abutment segment presses the component (10) against the first wall (11) of the heatsink (12).

6 Claims, 3 Drawing Sheets

FIXING DEVICE FOR FIXING ELECTRONIC COMPONENT AGAINST A WALL OF A HEATSINK

FIELD OF THE INVENTION

The invention relates to fixing devices for fixing electronic components against heatsinks.

BACKGROUND OF THE INVENTION

It is well known that certain electronic components, in particular of the active type, give off high levels of heat energy when they operate at high power. Such components are commonly associated with heatsinks designed to dissipate the heat energy given off by the components, so as to carry away the heat dissipated thereby and thus to lengthen the lives thereof. In general, the heat energy originates from the chips in the active components, and the packages (usually made of metal) containing the components are not capable of carrying away all of the heat energy. That is why thermal contact is made between the electronic components to be cooled and a wall of a heatsink (also referred to as a "dissipator"). FIG. 1 shows such a heatsink against which an electronic component is fixed.

In FIG. 1, a component 10 is pressed against a sidewall 11 of a heatsink 12. For example, the component 10 is a power transistor and its three connection pins are soldered to a printed circuit board 13. The heatsink 12 is also fixed to the printed circuit board 13 by means that are not shown. The heatsink 12 is constituted by an aluminum extrusion and has a plurality of fins 14 for dissipating the heat energy given off by the component 10.

The heat from the electronic component is dissipated well if the fixing means for fixing the component 10 on the wall 11 exerts sufficient pressure on the component thereon. The purpose of the pressure is to establish good thermal contact between the wall and the component, and the quality of the thermal coupling between the package containing the component and the heatsink is dependent on the magnitude of the pressure. Furthermore, in numerous applications, it is necessary for the component 10 to be electrically insulated from the heatsink 12 so as to avoid electrical short-circuits between various metal packages containing components and not having the same potential, and between the heatsink itself and the component 10.

Different means may be used to fix the component against the heatsink, and in particular the component may be fixed against a sidewall of the heatsink by means of a screw. In that technique, which is widely used, an insulating piece disposed in a recess provided in the component 10 prevents electrical contact from being made between the orifice (which is in general metal) and the heatsink via the screw. An insulating sheet, e.g. made of mica, is placed between the component and the heatsink. The main drawback of that fixing method is that it is difficult to implement when the insulation distances required between the component and the heatsink are large.

Moreover, that method involves machining the heatsink (boring a recess) in a direction that is perpendicular to the bores already machined in the heatsink for fixing it to the printed circuit board. For example, such bores enable the heatsink to be mounted on small vertical columns. It is inconvenient to have to machine along different axes because the heatsink then needs to be turned over. This is particularly inconvenient when the machines used (programmed numerically controlled machines) have only limited machining possibilities, e.g. in only one direction.

It is possible to machine in only one direction provided that the component can be fixed under the heatsink. The legs of the component must then be bent at 90° so that they can be soldered to the printed circuit board, and this complicates mounting considerably. Moreover, the orifice for fixing a component by means of a screw must be tapped, which is time-consuming, or else a nut and a locknut must be used to co-operate with the screw. Mounting a component on the heatsink is then more complex and also takes a long time. Finally, that technique can only be used with electronic components that have through holes for screws, and it cannot therefore be used with all types of components to be cooled.

Another solution is to press the component against a wall of the heatsink by means of a fixing clip, as shown in FIG. 2. FIG. 2 is a side view of a fixing clip 20 whose top end is held inside a cutout 21 provided in the sidewall 11 of the heatsink 12. The cutout 21 made either during extrusion, or by machining, is substantially rectangular in shape and has an opening in the sidewall 11, through which opening the body of the clip 20 can pass. The body of the clip 20 has a certain amount of resilience making it act as a spring, whereby a force F can be exerted on the component 10. The bottom end of the clip 20 is thus pressed against the front face of the component 10. A sheet of insulating material, e.g. made of mica, may be inserted between the rear face of the component 10 and the front face 11 of the heatsink 12.

That embodiment offers the advantage that it can be applied to any component to be cooled by means of the heatsink because the component needs no orifice. The components may, in particular, have different shapes.

However, machining the cutout 21 is complex to perform and therefore costly, and the same applies to the fixing clip 20. Furthermore, considerable machining is required, and, as a result, a large amount of matter is removed. Therefore, the heat removal qualities of the heatsink are reduced. Moreover, the only way to mount the clip 20 is to engage one of its ends in the cutout 21, and other clips serving to fix other components may obstruct the path of said clip. Finally, to obtain the cutout 21, it is advisable to make the design of the heatsink specific, thereby preventing many of the standard heatsinks on the market from being used.

An object of the present invention is to mitigate those drawbacks.

More precisely, an object of the invention is to provide a fixing device for fixing an electronic component against a wall of a heatsink, the fixing device providing optimum thermal contact between the component and the heatsink while also having a simple structure, being cheap, and being easy to adapt to the heatsink. The fixing device must therefore exert pressure on the component to press it against the heatsink so as to enhance heat transfer.

Another object of the invention is to provide such a fixing device that only requires limited machining of the heatsink.

SUMMARY OF THE INVENTION

These objects and others that appear below are achieved by providing a fixing device for fixing an electronic component against a first wall of a heatsink, the device being of the type comprising a fixing member constituted by:

- at least one end branch engaged in at least one recess provided in a second wall of the heatsink, and in the vicinity of the component; and
- at least one abutment segment opposite from the end branch(es) and designed to bear against the front face of the component whose rear face is pressed against the first wall, the abutment segment being connected to the end branch(es) by a resilient segment so that pressure is exerted on the front face of the component so as to press the component against the first wall;
- the device being characterized in that the end branch(es) can be substantially freely engaged in the recess in a direction that is perpendicular to the second wall, the end branch(es) being held inside the recess by being braced therein when the abutment segment presses the component against the first wall.

The fixing device of the invention therefore uses a fixing member which presses a component against a wall of a heatsink by the ends of the fixing member being braced inside one or more recesses.

Advantageously, each of the recesses is constituted by a respective hole provided in the second wall. It is therefore easy to make the recesses merely by boring the heatsink.

In an advantageous embodiment, the second wall is the wall constituting the bottom of the heatsink, the first wall being one of the sidewalls of the heatsink, the second wall having fixing bores for enabling the heatsink to be fixed to a printed circuit board, the fixing bores being bored in a direction parallel to the boring direction of the recesses.

In that case, the heatsink does not need to be turned over during the boring operation.

Preferably, the recesses are provided in the first wall.

The fixing member may be constituted by a spring steel wire, the portion situated at the center of the spring steel wire constituting the abutment segment.

The spring steel wire may be circular in cross-section. It is then very easy to make the fixing member merely by bending a steel wire.

In another embodiment, the recess is a sole recess, is substantially rectangular in shape, and is provided in the second wall, the fixing member being constituted by a spring blade having one end penetrating into the substantially rectangular recess.

Advantageously, prior to being pressed against the first wall by means of the fixing member, the electronic component is engaged in a sheath which is both electrically insulating and thermally conductive.

BRIEF DESCRIPTION OF THE DRAWINGS

Other characteristics and advantages of the invention will appear on reading the following description of two preferred embodiments, given by way of non-limiting example and with reference to the accompanying drawings, in which:

FIGS. 1 and 2 are described above with reference to the state of the art.

DESCRIPTION OF THE PREFERRED EMBODIMENTS

Figure 1:
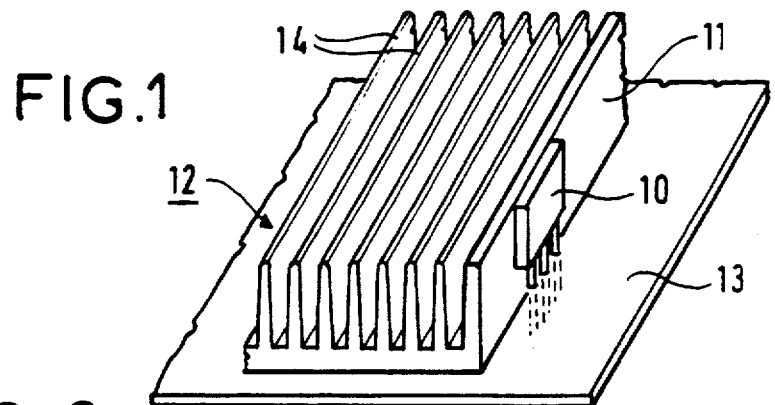
FIG. 1 is a perspective view of a heatsink including a wall against which an electronic component is fixed.

The fixing member 30 shown is constituted by two end branches 31, 32 forming prongs for being engaged in one or two recesses provided in a heatsink. Each of the end branches 31, 32 is extended by a respective resilient segment 33, 34 and 35, 36. The resilient segments 33, 34 and 35, 36 are interconnected by an abutment segment 37 for making contact with the component to be held against the heatsink. The fixing member 30 is symmetrical about an axis XX passing between the two end branches 31 and 32. For example, the fixing member 30 is made by bending a steel wire having a diameter of about 1 mm. The steel wire has a certain amount of spring, i.e. the position of the abutment segment 37 relative to the end branches 31, 32 may be modified without irreversibly deforming the resilient segments 33, 34 and 35, 36. The end branches 31 and 32 are preferably close to each other, as explained below, so as to be capable of being engaged in the same recess.

Figure 3:
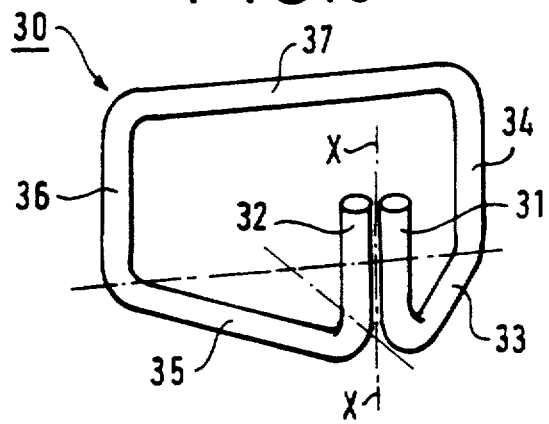
FIG. 3 is a perspective view of a fixing member in a preferred embodiment of the invention.
Figure 4:
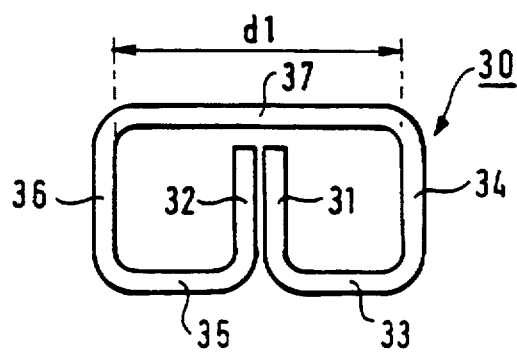
FIG. 4 is a front view of the FIG. 3 fixing member.
Figure 5:
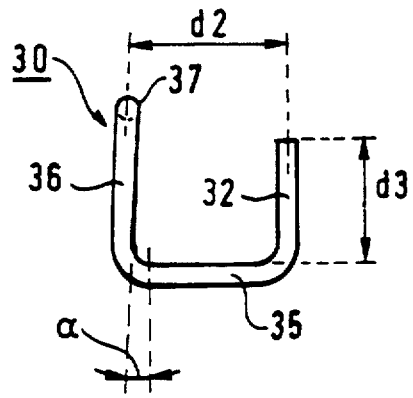
FIG. 5 is a side view of the fixing member shown in FIGS. 3 and 4.

FIGS. 4 and 5 are respectively a front view and a side view of the fixing member 30 shown in FIG. 3.

In FIG. 4, distance d1 between the two half-branches 34 and 36 is such as to enable them to be positioned on either side of an electronic component, as explained below. Therefore, distance d1 is a function of the width of the electronic component to be fixed against the heatsink.

In FIG. 5, d2 corresponds to the distance between the abutment segment 37 and the end branches 31 and 32. Distance d2 is a function both of the position of the recesses for receiving the end branches relative to the wall of the heatsink against which the component is to be pressed, and also of the thickness of said component. Distance d3 corresponds to the minimum depth of the recesses for receiving the end branches. Each of the half-branches 33 and 35 forms an angle $\alpha$, e.g. of about 5°, with its respective half-branch 34, 36.

Figure 6:
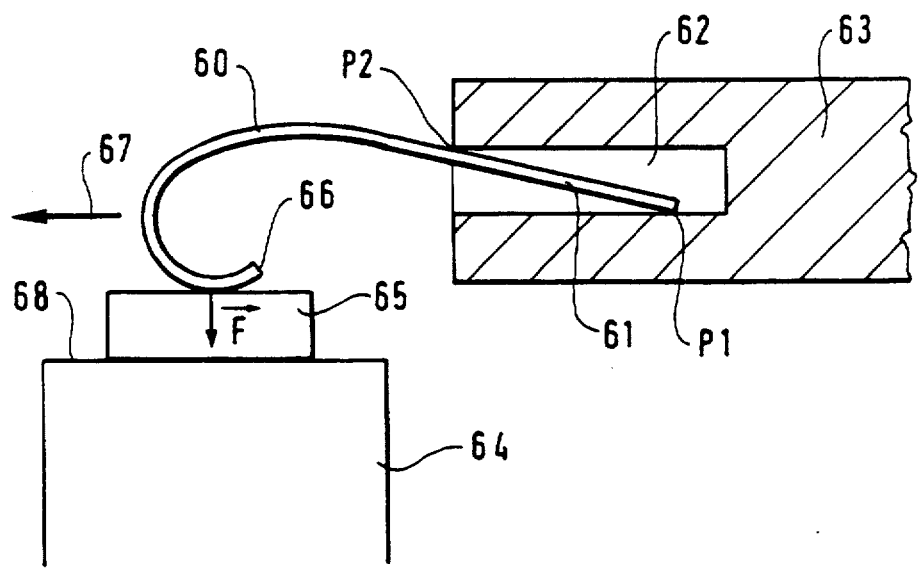
FIG. 6 shows how a part is fixed against a wall by means of a fixing member of the invention.

FIG. 6 makes it possible to understand the physical principle used by the present invention. A fixing member 60, e.g. constituted by a resilient metal blade, includes an end branch 61 engaged in a recess 62 provided in a member 63 that is fixed relative to a support 64 supporting a part 65. The member 63 and the support 64 are therefore fixed relative to each other. The other end branch 66 of the fixing member 60 abuts against the part 65, thereby holding the part 65 against the top surface 68 of the support 64. End branch 66 thus constitutes an abutment segment. A force $\vec{F}$ is exerted by the fixing member 60 on the part 65 and end branch 61 is braced inside the recess 62.

Figure 2:
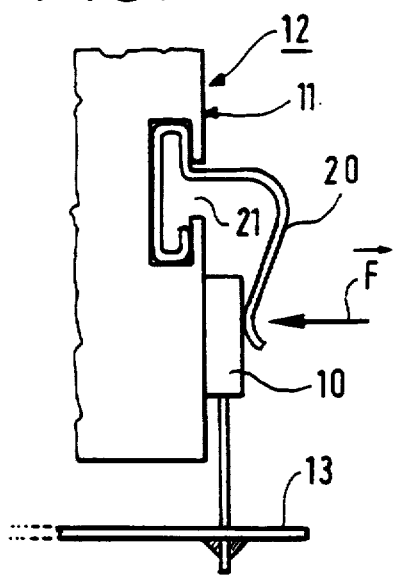
FIG. 2 shows a known way of fixing a component against a heatsink.

More precisely, end branch 61 is in contact with two opposite inside walls of the recess 62 at points P1 and P2. Point P1 is a contact point at which the end branch 61 makes contact with the inside of the recess 62, and it is situated on the side of the recess that is closer to the part 65. Contact point P2 is situated at the orifice of the recess 62 on the other side of the housing 62 relative to point P1. When the part 65 is to be released from the support 64, the central portion of the fixing member 60 is raised manually, and the part 65 can then be removed. When the fixing member 60 is released, the end branch is no longer in contact with point P2 (end branch 61 is no longer braced inside the recess 62), and the fixing member 60 can then be withdrawn axially from the recess 62 in a direction 67. In FIG. 6, the force $\bar{F}$ exerted is perpendicular to the long direction of the recess 62. It should be noted that this type of fixing requires forces and reactions that are not directed in the direction 67, unlike the closest state of the art example constituted by the device shown in FIG. 2, where a force opposite to $\bar{F}$ is applied to the clip 20.

To ensure that the force $\bar{F}$ pressing on the part 65 is sufficient, it is preferable for the fixing member 60 to be of limited length, i.e. for the recess 62 to be close to the location of the part 65.

In the present invention, this principle is applied to fixing an electronic component that dissipates heat energy against a wall of a heatsink.

Figure 7:
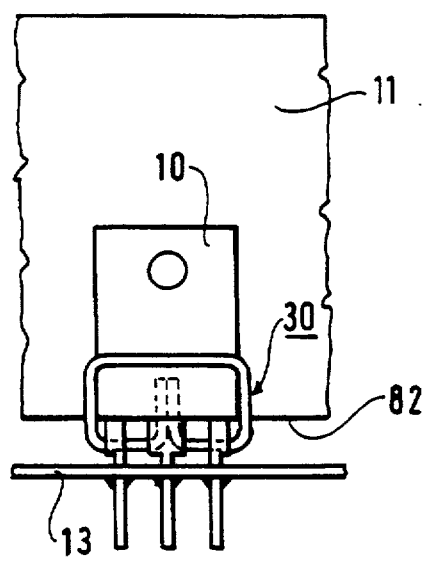
FIG. 7 shows how an electronic component is fixed against a sidewall of a heatsink by means of the fixing member shown in FIGS. 3 to 5.
Figure 8:
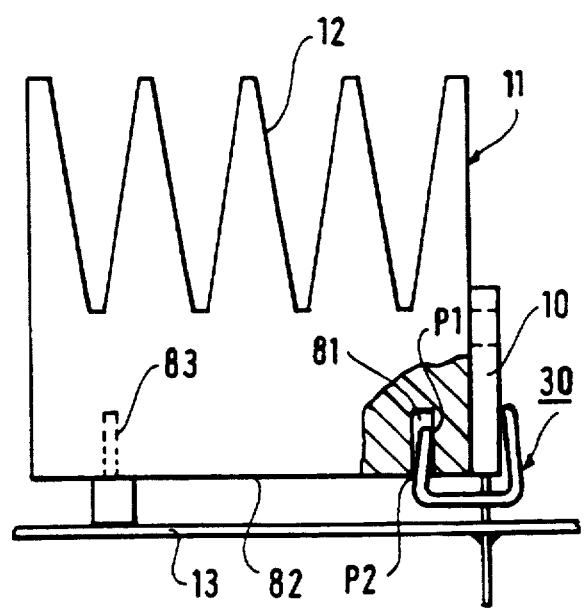
FIG. 8 is diagrammatic side view of the device shown in FIG. 7.

FIG. 7 shows how an electronic component is fixed against the wall of a heatsink by means of the fixing member shown in FIGS. 3 to 5 and in FIG. 8, which is an overall diagrammatic side view.

The electronic component 10 is pressed against the sidewall 11 of a heatsink 12 by means of the fixing member 30. The abutment segment of the member 30 is in contact with the front face of the component 10, and the resilient sections pass on either side of the component to reach the two end branches. The pressure is exerted in a direction that is substantially normal to the front face of the component 10. The end branches are engaged in a common recess 81 provided in a wall 82 that adjoins wall 11. The adjoining wall 82 constitutes the bottom of the heatsink 12. For example, the recess 81 is a bore or a hole bored parallel to wall 11, having a circular cross-section, and a diameter that is not less than the sum of the diameters of the end branches of the fixing member 30.

Other bores 83, referred to as "fixing" bores, are provided in wall 82. The fixing bores 83 receive fixing screws for fixing the heatsink 12 to a printed circuit board 13, to which the legs of the component 10 are soldered. Only one machining direction is then required for the heatsink 12. In this embodiment, the component 10 is pressed against the heatsink 12 by the member 30 before the heatsink 12 is fixed to the printed circuit board 13 and before the legs of the component 10 are soldered thereto. Naturally, each of the end branches of the member 30 may be engaged in a respective dedicated bore, but it is then necessary to provide two bores in wall 82 so as to hold the member 30. If the diameter of the bore 81 is equal to the sum of the diameters of the end branches, or if the diameter of each bore for receiving a respective end branch is equal to the diameter thereof, then the end branches are inserted by merely applying pressure manually, and the member 30 does not fall out under the effect of gravity before a component is inserted between the abutment segment and wall 11, as a result of the friction that is exerted inside the bores. The member may also be held by the end branches being kept apart resiliently inside one or two recesses, provided that a distance is satisfied between the end branches when the member 30 is in the rest position. This makes it possible to mount fixing members on a heatsink and to displace the heatsink without the fixing members falling out under the effect of gravity, e.g. as a result of shocks or vibrations.

The resilience of the resilient segments is calculated to exert high pressure (about 15 kg) on the component 10 when the end branches are braced inside the bore 81.

An electrically insulating and thermally conductive sheath may be threaded over the component 10 before it is fixed against the heatsink 12 so as to provide electrical insulation between the electronic component 10 and the heatsink 11. The sheath is of a conventional type, e.g. made of capton or of SILPAD 400 (registered trademark).

The fixing member 30 is preferably constituted by a spring steel wire having a high carbon content, which gives it good mechanical strength.

Naturally, other embodiments are possible, and the wire may also be made of another material, with a different cross-section (square, rectangular, etc.), and with a more complex shape (bent differently).

Another advantage of the invention is that the bore only requires a small amount of matter to be removed. It is important to keep the original thermal path of the heatsink as intact as possible, i.e. to limit the number and the size of the recesses provided for fixing the fixing members, otherwise the quality of the heat dissipation is reduced.

The heatsink may also be replaced by a heat drain for conveying the heat energy to a heatsink.

Figure 9:
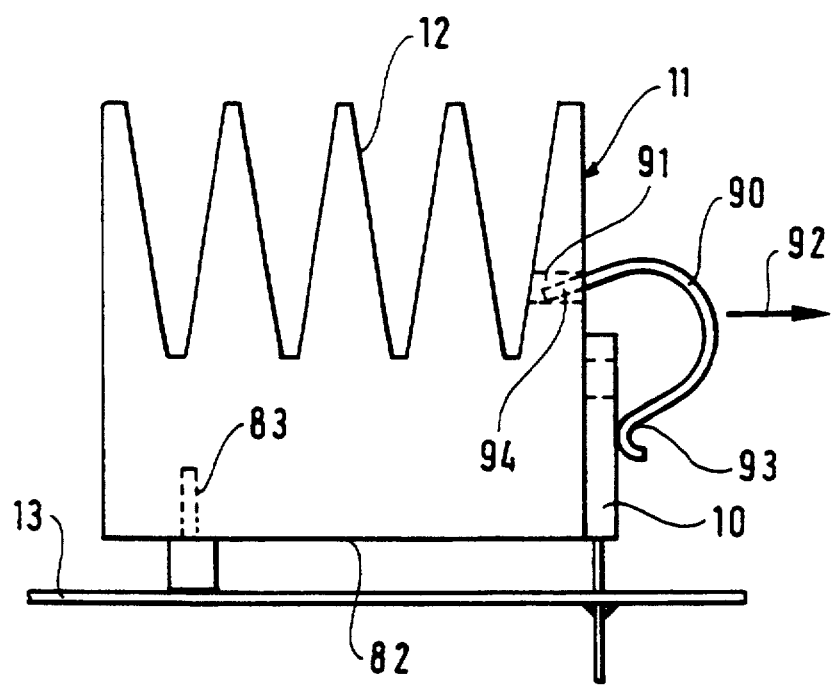
FIG. 9 shows another way of fixing an electronic component against a wall of a heatsink.

FIG. 9 shows another way of fixing an electronic component against a wall of a heatsink.

The fixing member 90 has an end branch 94 engaged in a recess 91 provided in the sidewall 11 of a heatsink 12. The abutment segment is constituted by the other end 93 of the fixing member 90, the intermediate section constituting the resilient section. A plurality of embodiments are possible:

- the fixing member 90 may be constituted by a resilient blade having a rectangular cross-section, in which case the recess 91 is also rectangular in shape; for example, the recess may be made by boring two adjoining bores;
- the fixing member 90 may also be constituted by a spring steel wire of the type shown in FIGS. 3 to 5, with an appropriate shape (substantially L-shaped) for fixing a component against a wall in which the recess for receiving the fixing member is provided. The recess 91 can then be constituted by one or two bores, as described above with reference to FIGS. 7 and 8.

The essential requirement is that the end(s) of the fixing member is/are braced in the end-branch receiving recess(es).

The only drawback of this embodiment compared with the preceding embodiment (FIGS. 7 and 8) is that bores must be provided in the heatsink 12 in two different faces, because a plurality of bores in face 82 are necessary for fixing the heatsink 12 to the printed circuit board 13. It is also necessary to make sure that the bore 91, and therefore the end fin in which the bore is provided, is deep enough to hold the fixing member. However, the bore 91 does not have to be provided above the component 10, the essential requirement being that the bore is not too far away from the component, so as to limit the length of the fixing member 90, and thereby to enable sufficient pressure to be exerted on the component. Therefore, the bore may be situated in the thickest portion of the heatsink, in particular level with the component 10.

However, this embodiment offers the advantage of enabling the fixing member to be removed very quickly and simply, since the fixing member merely needs to be withdrawn axially, i.e. in a direction 92, for the component 10 to be released.

The fixing device of the invention offers numerous advantages over existing devices:

- its structure is simple and it can be secured to the heatsink by means of a single bore provided in the heatsink, which bore can be made parallel to other bores which have to be made in any case to enable the heatsink to be fixed to a support, e.g. a printed circuit board;
- the bore does not limit the quality of heat dissipation, since only a small amount of matter is removed; and
- it is easy both to fix and to release the component, because both fixing and releasing can be performed axially.

We claim:

1. Device for attachment of an electronic component (10) having a front face and a rear face against a first wall (11) of a heatsink (12), said device comprising a fixing member (30) consisting of:

at least one end branch (31, 32) engaged in at least one recess (81) within a second wall (82) of said heatsink (12) in proximity to said component (10), said second wall (82) being perpendicular to said first wall (11);

a support section (37) set opposite said at least one terminal end branch (31, 32) and designed to be supported against said front face of said component (10), with said rear face thereof pressed against said first wall (11), said support section (37) being connected to said at least one end branch (31, 32) by an elasticized section (34, 36), such that thrust is exerted on said front face of said component (10) so as to press said component (10) against said first wall (11), said at least one end branch (31, 32) being capable of substantially free engagement in said at least one recess (81) and in a direction perpendicular to said second wall (82) and being held in place by being pressed in said at least one recess (81) when said support section (37) presses said component (10) against said first wall (11), and wherein said second wall (82) forms a bottom of said heatsink (12) and includes a fixing bore (83) designed to allow attachment of said heatsink (12) to a printed circuit (13), said fixing bore (83) being in a drilling direction extending parallel to the direction of said at least one recess (81).

2. Device according to claim 1, wherein the length of said at least one end branch is greater than the distance separating said second wall (82) of said heatsink and said printed circuit (13), such that said fixing member (30) cannot pull out of said at least one recess (81) when said heatsink (12) is attached to said printed circuit (13).

3. Device according to claim 1, wherein said at least one recess (81) consists of a hole in said second wall (82) forming the bottom of said heatsink (12).

4. Device according to claim 1, wherein said fixing member (30) consists of a steel spring wire, and wherein a portion located in the center of said steel spring wire constitutes said support section (37).

5. Device according to claim 4, wherein said steel spring wire has a circular cross-section.

6. A member for fixing a component (10) against a first wall of a heatsink, said member consisting of a steel spring wire comprising:

end branches (31, 32) designed to be engaged in a recess of said heatsink;

a support section (37) set opposite said end branches (31, 32), designed to come into contact with said component (10) and being connected at opposite ends to said end branches (31, 32) by an elasticized section consisting of two arms (34, 36) separated by a distance (d1) at least equal to a width of said component (10).

* * * * *